(12) United States Patent
Luo et al.

(10) Patent No.: US 12,058,825 B2
(45) Date of Patent: Aug. 6, 2024

(54) FLEXIBLE DISPLAY APPARATUS

(71) Applicant: BOE Technology Group Co., Ltd., Beijing (CN)

(72) Inventors: Xiaofei Luo, Beijing (CN); Shangchieh Chu, Beijing (CN); Hong Zhu, Beijing (CN); Yanyan Yang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 287 days.

(21) Appl. No.: 17/772,485

(22) PCT Filed: Jul. 7, 2021

(86) PCT No.: PCT/CN2021/105026
§ 371 (c)(1),
(2) Date: Apr. 27, 2022

(87) PCT Pub. No.: WO2022/042063
PCT Pub. Date: Mar. 3, 2022

(65) Prior Publication Data
US 2022/0346253 A1    Oct. 27, 2022

(30) Foreign Application Priority Data
Aug. 26, 2020   (CN) .......................... 202021815370.8

(51) Int. Cl.
*G06F 1/16*       (2006.01)
*H05K 5/00*       (2006.01)
*H05K 5/02*       (2006.01)
*H05K 7/00*       (2006.01)

(52) U.S. Cl.
CPC ......... *H05K 5/0217* (2013.01); *H05K 5/0018* (2022.08)

(58) Field of Classification Search
CPC ... H05K 5/0217; H05K 5/0018; G06F 1/1652
See application file for complete search history.

(56) References Cited

U.S. PATENT DOCUMENTS 9,519,313 B2 * 12/2016 Kim ..................... G06F 1/166
9,733,672 B2 *  8/2017 Kim ..................... G06F 1/1652
10,143,096 B2 * 11/2018 Park ..................... F16H 1/20
(Continued)

FOREIGN PATENT DOCUMENTS

CN   205945842 U   2/2017
CN   107980157 A   5/2018
(Continued)

*Primary Examiner* — Anthony M Haughton
(74) *Attorney, Agent, or Firm* — IPro, PLLC (57) ABSTRACT

A flexible display apparatus includes a support frame, a housing, a roller, a flexible display screen, and a limit mechanism; wherein the support frame includes a scissor rack; the housing includes a first portion and a second portion that are detachable; the roller is disposed in the first portion, one end of the flexible display screen is connected to the roller, and the other end of the flexible display screen is connected to the second portion; and the limit mechanism is connected to the scissor rack, and the limit mechanism is disposed on at least one of the first portion and the second portion to limit relative movement between a symmetry axis of the scissor rack and a portion where the limit mechanism is disposed.

20 Claims, 10 Drawing Sheets

(56) References Cited

U.S. PATENT DOCUMENTS

| | | | |
|---|---|---|---|
| 10,146,260 B2 * | 12/2018 | Lee | H05K 5/0017 |
| 10,257,945 B2 * | 4/2019 | Kim | H05K 1/147 |
| 10,750,625 B2 * | 8/2020 | Park | G06F 1/1652 |
| 10,827,052 B1 * | 11/2020 | Han | H04M 1/0241 |
| 10,940,760 B2 * | 3/2021 | Eom | B60K 35/00 |
| 10,963,016 B1 * | 3/2021 | Oh | G06F 3/0416 |
| 11,029,733 B2 * | 6/2021 | Lee | G06F 1/1652 |
| 2016/0054758 A1 | 2/2016 | Han | |
| 2019/0387633 A1 | 12/2019 | Liao | |
| 2020/0022269 A1 | 1/2020 | Liao | |
| 2021/0169242 A1 | 6/2021 | Luo et al. | |
| 2022/0253104 A1 | 8/2022 | Luo et al. | |

FOREIGN PATENT DOCUMENTS

| | | |
|---|---|---|
| CN | 108064404 A | 5/2018 |
| CN | 109887419 A | 6/2019 |
| CN | 111462635 A | 7/2020 |
| CN | 211118419 U | 7/2020 |
| CN | 211289405 U | 8/2020 |
| CN | 212724535 U | 3/2021 |

\* cited by examiner

FLEXIBLE DISPLAY APPARATUS

CROSS-REFERENCE TO RELATED APPLICATION

This application is a US national phase application based on PCT/CN2021/105026, filed on Jul. 7, 2021, which claims priority to the Chinese Patent Application No. 202021815370.8, filed on Aug. 26, 2020, and entitled "FLEXIBLE DISPLAY APPARATUS," the disclosures of which are incorporated herein by reference in their entireties.

TECHNICAL FIELD

The present disclosure relates to the field of display devices, and in particular, relates to a flexible display apparatus.

BACKGROUND

A roller-type flexible display apparatus is a display apparatus having a rollable display screen. Usually, the roller-type flexible display apparatus includes a support frame, a housing, a roller, and a flexible display screen. The housing includes a first portion and a second portion that are detachable. The support frame is attached between the first portion and the second portion. The roller is disposed in the first portion. The flexible display screen is rolled on the roller. One end of the flexible display screen protrudes from the first portion and is fixed to second portion. The flexible display screen can be pulled out of the first portion by separating the first portion from the second portion, i.e., by pulling the first portion and the second portion. In a process of pulling the first portion and the second portion, the support frame is unfolded, to support the flexible display screen.

SUMMARY OF THE UTILITY MODEL

Embodiments of the present disclosure provide a flexible display apparatus. The flexible display apparatus includes a support frame, a housing, a roller, a flexible display screen, and a limit mechanism, wherein
  the support frame includes a scissor rack;
  the housing includes a first portion and a second portion that are detachable, wherein the first portion is disposed at one end of the scissor rack; and the second portion is disposed at the other end of the scissor rack;
  the roller is disposed in the first portion, one end of the flexible display screen is connected to the roller, and the other end of the flexible display screen is connected to the second portion; and
  the limit mechanism is connected to the scissor rack, and the limit mechanism is disposed on at least one of the first portion and the second portion, to limit relative movement between a symmetry axis of the scissor rack and a portion where the limit mechanism is disposed, wherein the symmetry axis of the scissor rack is a symmetry axis extending in a stretching direction of the scissor rack.

Optionally, the limit mechanism includes a first gear rack, a second gear rack, and a synchronizing gear, wherein
  a length direction of the first gear rack is parallel to an axis of the roller, the first gear rack is parallel to the second gear rack, the first gear rack is hinged to one scissor arm at an end of the scissor rack, and the second gear rack is hinged to the other scissor arm at the end of the scissor rack; and
  the synchronizing gear is disposed between the first gear rack and the second gear rack, and is meshed with the first gear rack and the second gear rack.

Optionally, the limit mechanism further includes a track, wherein the first gear rack and the second gear rack are slidably mounted on the track, and the synchronizing gear is rotationally mounted on the track.

Optionally, the first gear rack includes a first plate portion and a first rod portion connected to each other, wherein one side of the first rod portion has teeth;
  the second gear rack includes a second plate portion and a second rod portion connected to each other, wherein one side of the second rod portion has teeth; and
  the first plate portion and the second plate portion are both connected to the track, and are spaced apart in a length direction of the track, the first rod portion and the second rod portion are both disposed in the length direction of the track, and are both disposed between the first plate portion and the second plate portion, and the first rod portion and the second rod portion are spaced apart in a width direction of the track.

Optionally, the limit mechanism includes one synchronizing gear, wherein the synchronizing gear is disposed between the first rod portion and the second rod portion, and the first gear rack and the second gear rack are symmetrically disposed about a center of the synchronizing gear, or the limit mechanism includes at least two synchronizing gears, wherein all the synchronizing gears are disposed between the first rod portion and the second rod portion, and are sequentially arranged in the length direction of the track.

Optionally, the scissor rack includes a plurality of scissor rack units that are successively hinged, wherein each of the scissor rack units include two scissor arms and a limit portion, wherein middle portions of the two scissor arms are hinged to each other and the limit portion is disposed on a hinge axis of the two scissor arms; and
  the track is provided with a limit structure, wherein in the case that the scissor rack is folded, the limit structure is matched with the limit portion to limit displacement, in an axial direction of the roller, of the hinge axis of the two scissor arms.

Optionally, the limit structure includes two baffle plates, wherein the two baffle plates are disposed on a side, proximal to the scissor rack, of the track, the two baffle plates are spaced apart in the length direction of the track, and in the case that the scissor rack is folded, the limit portion is disposed between the two baffle plates.

Optionally, the first portion and the second portion are each provided with the limit mechanisms, wherein along the hinge axis of the two scissor arms, the two baffle plates on the track of one of the two limit mechanisms are disposed on one side of the scissor rack, and the two baffle plates on the track of the other one of the two limit mechanisms are disposed on the other side of the scissor rack.

Optionally, in the scissor rack, an elastic gasket is clamped between the hinged scissor arms and is disposed at a hinge joint between the scissor arms.

Optionally, an outer wall of the roller is provided with a step portion, wherein one end of the flexible display screen is disposed on a lower side of the step portion.

Optionally, a cross section of an outer wall of the roller is a helix.

Optionally, a height of the step portion is equal to a thickness of the flexible display screen.

Optionally, the flexible display screen includes a flexible cover plate, a first bonding layer, a second bonding layer, and a flexible display module, wherein the first bonding layer, the second bonding layer, and the flexible display module are disposed on one side of the flexible cover plate, the flexible display module is disposed between the first bonding layer and the second bonding layer, the first bonding layer is connected to the roller, and the second bonding layer is connected to the second portion.

Optionally, the flexible display apparatus further includes two roller springs, wherein the two roller springs are respectively disposed at two ends of the roller, and both the first portion and the roller are connected to the roller springs.

BRIEF DESCRIPTION OF THE DRAWINGS

In order to describe the technical solutions in the embodiments of the present disclosure more clearly, the following briefly describes the accompanying drawings required for describing the embodiments. Apparently, the accompanying drawings in the following description show merely some embodiments of the present disclosure, and those of ordinary skill in the art can still derive other drawings from these accompanying drawings without creative efforts.

DETAILED DESCRIPTION

To make the objectives, technical solutions, and advantages of the present disclosure clearer, the following further describes implementations of the present disclosure in detail with reference to the accompanying drawings.

Figure 1:
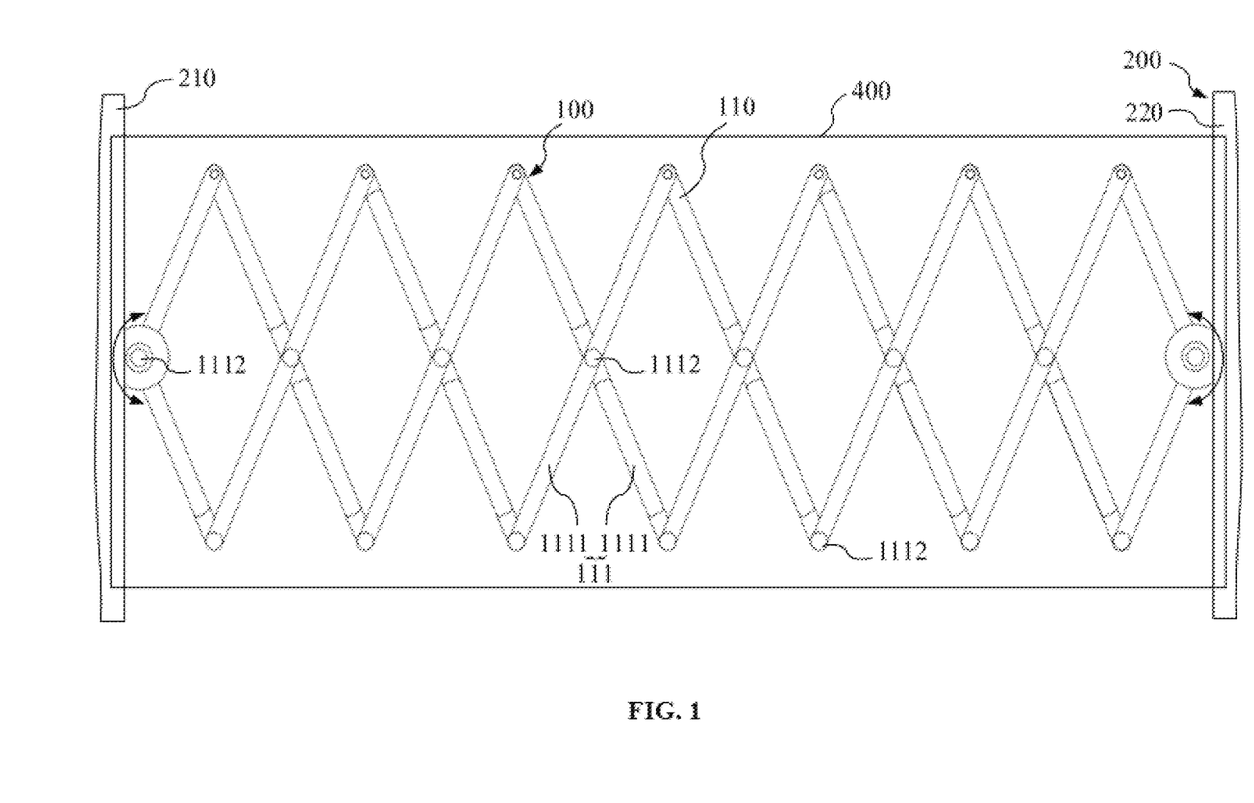
FIG. 1 is a schematic diagram of a local structure of a flexible display apparatus in the related art.

FIG. 1 is a schematic diagram of a local structure of a flexible display apparatus in the related art. As shown in FIG. 1, the flexible display apparatus includes a support frame 100, a housing 200, and a flexible display screen 400. The housing 200 includes a first portion 210 and a second portion 220 that are detachable. The flexible display screen is attached between the first portion 210 and the second portion 220, and can be rolled on a roller in the first portion 210.

The support frame 100 includes a scissor rack 110. The scissor rack 110 includes a plurality of scissor rack units 111 that are successively hinged. Each of the scissor rack units 111 include two scissor arms 1111 hinged to each other by pin shafts 1112.

In the two scissor rack units 111 disposed at two ends of the scissor rack 110, the pin shaft 1112 of one scissor rack unit 111 is hinged to the first portion 210, and the pin shaft 1112 of the other scissor rack unit 111 is hinged to the second portion 220. In the case that the first portion 210 and the second portion 220 are separated, the scissor rack 110 is extended under the action of pulling force of pulling apart the first portion 210 and the second portion 220. Because the two ends of the scissor rack 110 are connected to the first portion 210 and the second portion 220 by the pin shafts 1112, both the first portion 210 and the second portion 220 can rotate relative to the scissor rack 110, as shown by the double-headed arrow in FIG. 1. This may cause the flexible display screen to skew and result in rolling dislocation of the flexible display screen during a process of rolling the flexible display screen.

Figure 2:
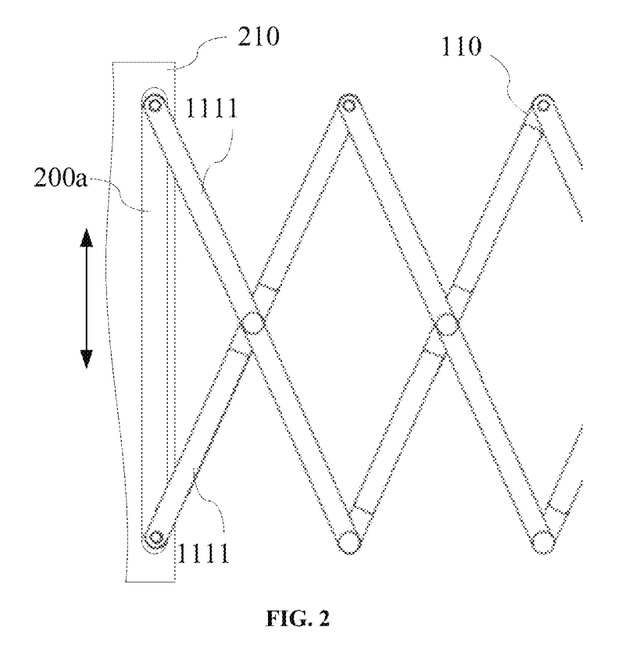
FIG. 2 is a schematic diagram of a local structure of a flexible display apparatus in the related art.

FIG. 2 is a schematic diagram of a local structure of another flexible display apparatus in the related art. FIG. 2 schematically illustrates a structure of a junction between the first portion 210 and the scissor rack 110. In the display apparatus shown in FIG. 2, sliding slots 200a are disposed on the first portion 210 and the second portion 220. In the two scissor rack units 111 disposed at two ends of the scissor rack 110, ends of the two scissor arms 1111 of one scissor rack unit 111 are slidably disposed in the sliding slot 200a on the first portion 210, and ends of the two scissor arms 1111 of the other scissor rack unit 111 are slidably disposed in the sliding slot 200a on the second portion 220. The first portion 210 and the second portion 220 may be translated relative to the scissor rack 110 in an axial direction of the roller of the flexible display screen, as shown by the double-headed arrow in FIG. 2. This may also easily cause the flexible display screen to skew and rolling dislocation of the flexible display screen during a process of extending rolling the flexible display screen, even leading to breakage of the flexible display screen.

Figure 3:
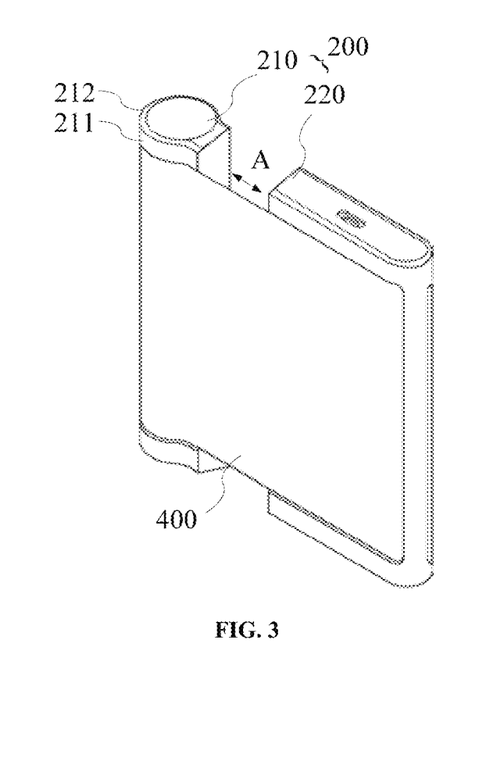
FIG. 3 is a schematic diagram of an external structure of a flexible display apparatus according to an embodiment of the present disclosure.

FIG. 3 is a schematic diagram of an external structure of a flexible display apparatus according to an embodiment of the present disclosure. As shown in FIG. 3, the flexible display apparatus includes a housing 200 and a flexible display screen 400. The housing 200 includes a first portion 210 and a second portion 220 that are detachable. For example, in FIG. 3, the first portion 210 and the second portion 220 may move in a specified direction (for example, the direction of the double-headed arrow A in the figure) to achieve coalescence or separation. The length directions of the first portion 210 and the second portion 220 are parallel to each other. The specified direction is perpendicular to the length direction.

Figure 4:
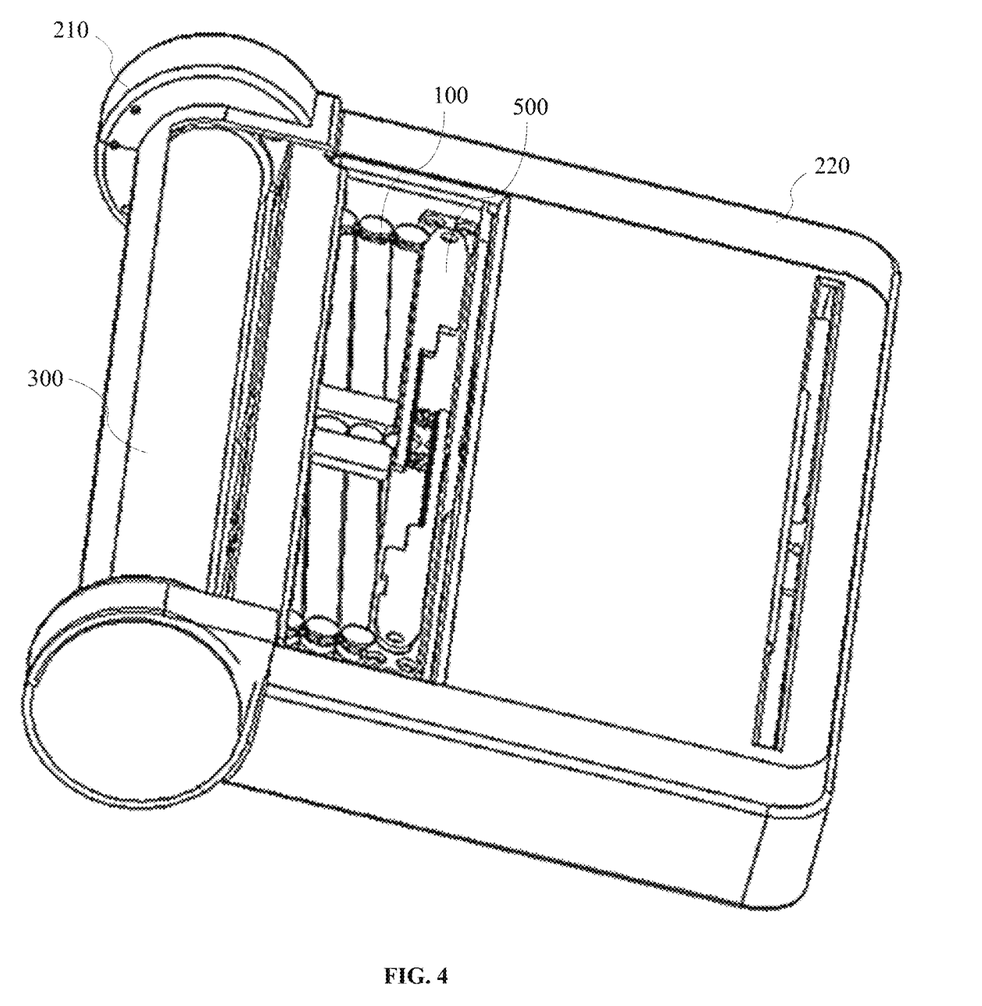
FIG. 4 is a schematic structural diagram of the flexible display apparatus shown in FIG. 3.

FIG. 4 is a schematic structural diagram of the flexible display apparatus shown in FIG. 3. In FIG. 4, the external wall of the first portion 210 of the housing 200 is partially omitted to facilitate display of the interior of the first portion 210. In addition, the flexible display screen 400 is omitted. As shown in FIG. 4, the flexible display apparatus further includes a support frame 100, a roller 300, and a limit mechanism 500.

The roller 300 is disposed in the first portion 210. One end of the flexible display screen 400 is connected to the roller 300. The other end of the flexible display screen 400 is connected to the second portion 220.

Figure 5:
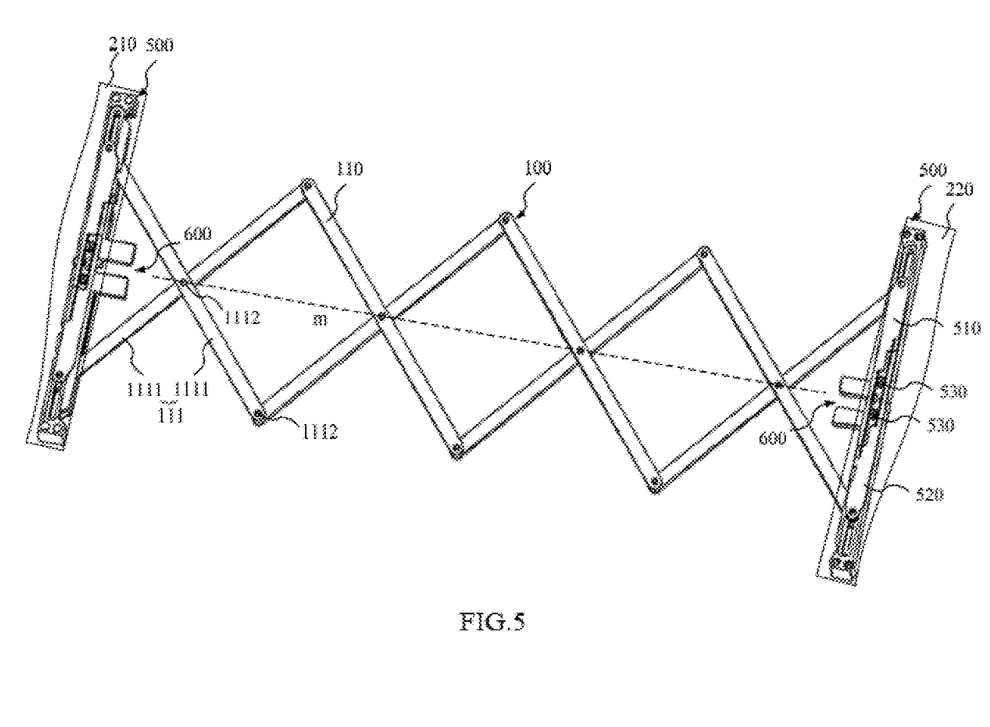
FIG. 5 is a schematic diagram of a local structure of a flexible display apparatus according to an embodiment of the present disclosure.

FIG. 5 is a schematic diagram of a local structure of a flexible display apparatus according to an embodiment of the present disclosure. A support frame 100 and a limit mechanism 500 are shown in the figure. A first portion 210 and a second portion 220 of a housing 200 are illustrated in dashed boxes. As shown in FIG. 5, the support frame 100 includes a scissor rack 110.

The first portion 210 is disposed at one end of the scissor rack 110. The second portion 220 is disposed at the other end of the scissor rack 110.

The limit mechanism 500 is connected to the scissor rack 110. The limit mechanism 500 is disposed on the first portion 210 and the second portion 220 to limit relative movement between a symmetry axis m of the scissor rack 110 and a portion where the limit mechanism 500 is disposed.

The symmetry axis m of the scissor rack 110 is a symmetry axis extending in a stretching direction (for example, the stretching direction is parallel to the specified direction) of the scissor rack 110.

The symmetry axis m of the scissor rack 110 is a connection line of pin shafts 1112 hinged in the middle portions of the two scissor arms 1111 in each scissor rack unit 111 in the scissor rack 110.

For example, as shown in FIG. 1 and FIG. 2, the relative movement herein includes rotation and translation.

In a process of pulling the first portion and the second portion to extend the flexible display screen or pushing the first portion and the second portion together to fold the flexible display screen, the limit mechanism can limit the relative movement between the symmetry axis of the scissor rack and the portion where the limit mechanism is disposed, thereby avoiding skewing the flexible display screen in a plane where the scissor rack is disposed, and facilitating preventing rolling dislocation of the flexible display screen.

As shown in FIG. 3, the first portion 210 of the housing 200 may include a cylinder body 211 accommodating the roller 300 and end covers 212 disposed at two ends of the cylinder body 211. The end covers 212 are in detachable connection with the cylinder body 211, to facilitate disassembly and maintenance for the internal structure of the first portion 210 of the housing 200.

A PCB (Printed Circuit Board) of the flexible display apparatus may be disposed in the second portion 220 of the housing 200.

As shown in FIG. 5, the scissor rack 110 includes a plurality of scissor rack units 111 that are successively hinged. Each of the scissor rack units 111 include two scissor arms 1111 whose middle portions are hinged to each other. The two scissor arms 1111 are hinged to each other by a pin shaft 1112. In a stretching process of the scissor rack 110, connected scissor arms 1111 rotate around the pin shaft 1112.

The limit mechanism 500 is disposed on only one of the first portion 210 and the second portion 220 of the housing 200. For example, the limit mechanism 500 is disposed on the first portion 210, and the limit mechanism 500 can limit relative movement between the first portion 210 and a symmetry axis m of the scissor rack 110. Or the limit mechanism 500 is disposed on the second portion 220, and the limit mechanism 500 can limit relative movement between the second portion 220 and the symmetry axis in of the scissor rack 110.

Figure 6:
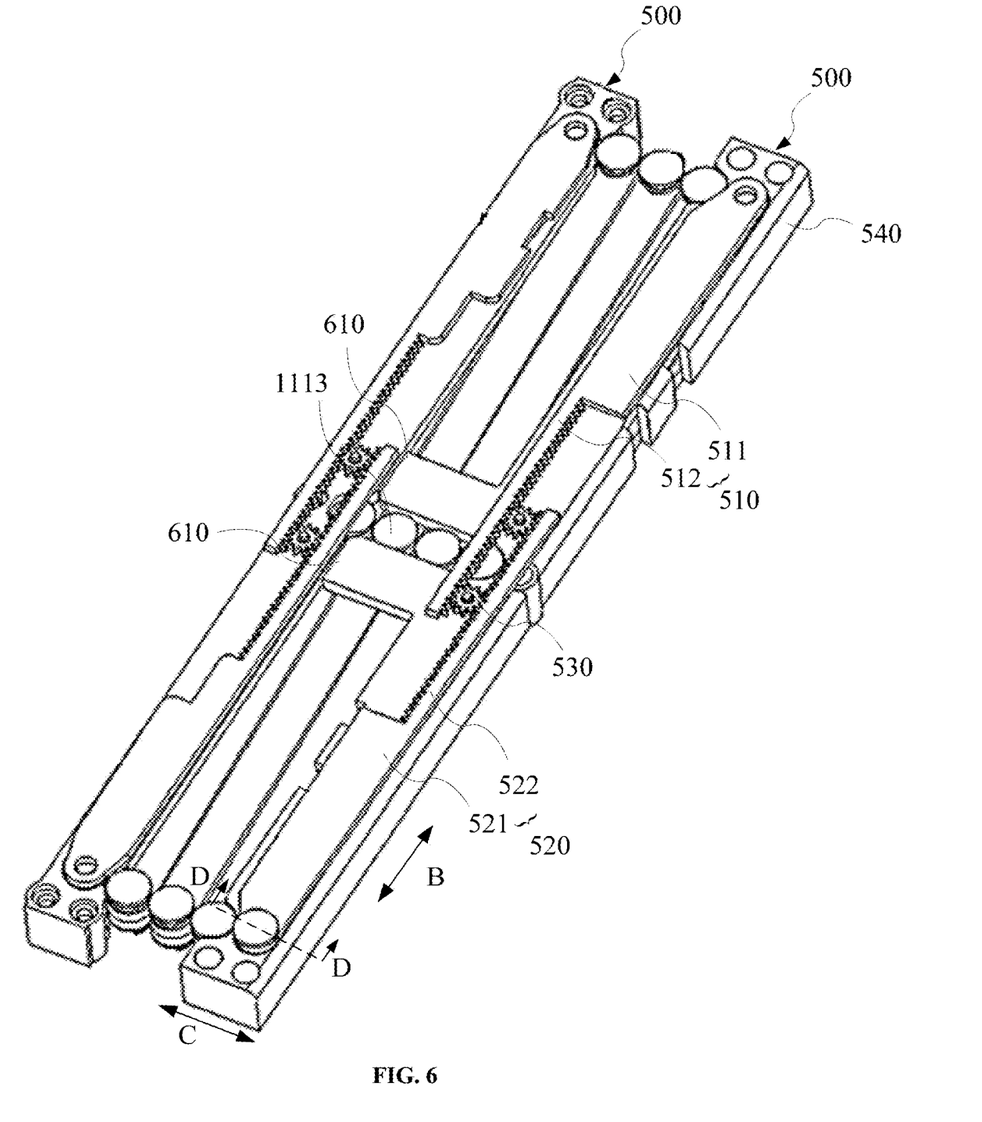
FIG. 6 is a schematic state diagram of the flexible display apparatus shown in FIG. 5 in the case that a support frame is folded.

FIG. 6 is a schematic state diagram of the flexible display apparatus shown in FIG. 5 in the case that a support frame is folded. As shown in FIG. 6, the limit mechanism 500 includes a first gear rack 510, a second gear rack 520, and a synchronizing gear 530.

The length direction (for example, the direction shown by the arrow B in FIG. 6) of the first gear rack 510 is parallel to the axis of the roller 300. The first gear rack 510 is parallel to the second gear rack 520. The first gear rack 510 is hinged to one scissor arm 1111 at an end of the scissor rack 110. The second gear rack 520 is hinged to the other scissor arm 1111 at the end of the scissor rack 110.

The synchronizing gear 530 is disposed between the first gear rack 510 and the second gear rack 520, and is meshed with the first gear rack 510 and the second gear rack 520.

Because both the first gear rack 510 and the second gear rack 520 are meshed with the synchronizing gear 530, the first gear rack 510 and the second gear rack 520 can just move synchronously. Therefore, in the case that the scissor rack 110 is stretched upon being connected to the first gear rack 510 and the second gear rack 520, movement amounts of the two scissor arms 1111 connected to the same limit mechanism 500 are always kept equal in response to extending the scissor rack 110. The displacement of the entire scissor rack 110 relative to the first portion 210 and the second portion 220 in the axial direction of the roller 300 is kept as 0, and both the first portion 210 and the second portion 220 cannot rotate relative to the scissor rack 110. In this way, the flexible display screen is prevented from skewing, thereby preventing rolling dislocation of the flexible display screen during a process of extending the flexible display screen.

As shown in FIG. 6, the limit mechanism 500 includes two synchronizing gears 530 spaced apart. In one limit mechanism 500, both the first gear rack 510 and the second gear rack 520 are meshed with the two synchronizing gears 530, such that the first gear rack 510 and the second gear rack 520 can move more stably.

In other embodiments, the limit mechanism 500 may include one synchronizing gear 530. The first gear rack 510 and the second gear rack 520 may be symmetrically disposed about the center of the one synchronizing gear 530. Alternatively, the limit mechanism 500 may include three or more synchronizing gears 530 spaced apart, and both the first gear rack 510 and the second gear rack 520 are meshed with each of the synchronizing gears 530.

In the case that the limit mechanism 500 includes two or more synchronizing gears 530, each of the synchronizing gears 530 has an equal diameter, such that both the first gear rack 510 and the second gear rack 520 can be meshed with each synchronizing gear 530, in the case that the first gear rack 510 is parallel to the second gear rack 520.

As shown in FIG. 6, the limit mechanism 500 may further include a track 540.

The first gear rack 510 and the second gear rack 520 are slidably mounted on the track 540. The synchronizing gear 530 is rotationally mounted on the track 540. The first gear rack 510, the second gear rack 520, and the synchronizing gear 530 are mounted on the track 540, and then the combination is mounted to the first portion 210 or the second portion 220, which facilitates mounting of the limit mechanism 500. For example, a rotating shaft of the synchronizing gear 530 may be mounted on the track 540, such that the synchronizing gear 530 is fixed relative to the track 540, and can rotate around the rotating shaft.

For example, the track 540 may be fixed on the housing 200 by a screw.

The structure of the first gear rack 510 may be the same as the structure of the second gear rack 520. As shown in FIG. 6, the gear rack 510 includes a first plate portion 511 and a first rod portion 512 connected to each other. One side of the first rod portion 512 has teeth. The second gear rack 520 includes a second plate portion 521 and a second rod portion 522 connected to each other. One side of the second rod portion 522 has teeth.

The first plate portion 511 and the second plate portion 521 are both connected to the track 540, and are spaced apart in the length direction of the track 540. The first rod portion 512 and the second rod portion 522 are both disposed in the length direction of the track 540, and are both disposed between the first plate portion 511 and the second plate portion 521. The first rod portion 512 and the second rod portion 522 are spaced apart in a width direction of the track 540. The length direction of the track 540 is the same as the length direction of the first gear rack 510, that is, the direction shown by the arrow B in FIG. 6. The width direction of the track 540, that is, the direction shown by the arrow C in FIG. 6, is perpendicular to the length direction of the track 540.

In the case that the limiting mechanism 500 includes one synchronizing gear 530, the synchronizing gear 530 may be disposed between the first rod portion 512 and the second rod portion 522. The first gear rack 510 and the second gear rack 520 are symmetrically disposed about the center of the synchronizing gear 530.

In the case that the limiting mechanism 500 includes two or more synchronizing gears 530, all the synchronizing gears 530 are disposed between the first rod portion 512 and the second rod portion 522, and are sequentially arranged in the length direction of the track 540. Teeth on the first rod portion 512 and teeth on the second rod portion 522 are both meshed with each of the synchronizing gears 530, such that the first gear rack 510 and the second gear rack 520 can move more stably.

Figure 7:
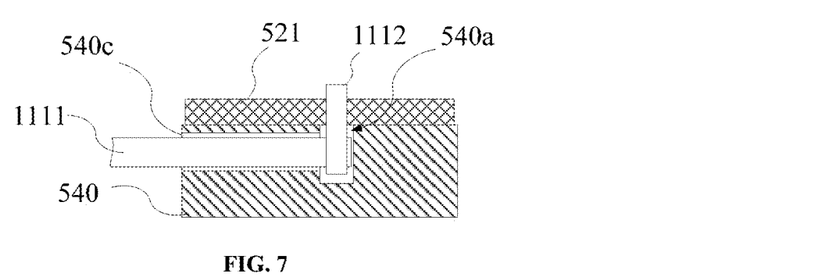
FIG. 7 is a sectional view of D-D in FIG. 6.

The first gear rack 510 and the second gear rack 520 may be connected to the track 540 in an identical fashion. In some embodiments of the present disclosure, FIG. 7 is a sectional view of D-D in FIG. 6. As shown in FIG. 7, the track 540 may be provided with a chute 540a extending in the length direction of the track 540. Both the first gear rack 510 and the second gear rack 520 are disposed out of the chute 540a. A side wall of the chute 540a is provided with a bar opening 540c. The bar opening 540c extends along the chute 540a. A scissor arm 1111 connected to the second gear rack 520 may be disposed in the bar opening 540c. A pin shaft 1112 is connected to an end of the scissor arm 1111, and is disposed in the chute 540a. The scissor arm 1111 is hinged to the second plate portion 521 of the second gear rack 520 by the pin shaft 1112.

In the case that the scissor rack 110 is extended, the scissor arm 1111 connected to the second gear rack 520 may move along the bar opening 540c, and the pin shaft 1112 may move along the chute 540a, thereby driving the second gear rack 520 to move.

Figure 8:
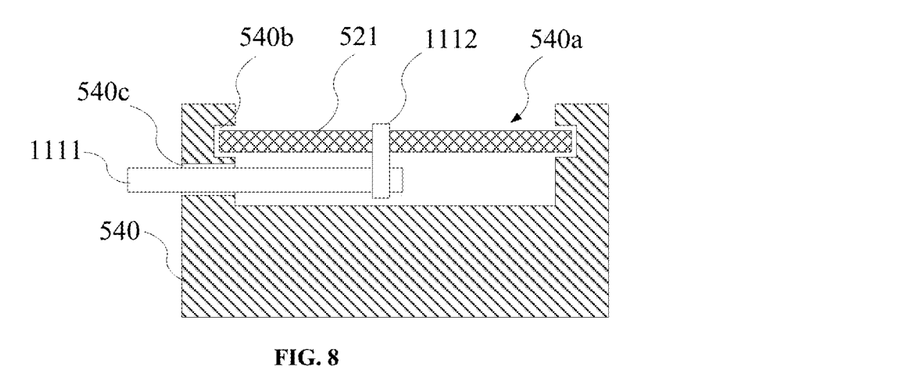
FIG. 8 is a sectional view of D-D of another flexible display apparatus according to an embodiment of the present disclosure.

In some other embodiments of the present disclosure, the track 540 is provided with a chute 540a extending in the length direction of the track 540. The first gear rack 510, the second gear rack 520, and the synchronizing gear 530 may be all disposed in the chute 540a. FIG. 8 is a sectional view of D-D of another flexible display apparatus according to an embodiment of the present disclosure. As shown in FIG. 8, the chute 540a is provided with two opposite side walls. Each of the side walls is provided with a groove 540b extending along the chute 540a. The second plate portion 521 of the second gear rack 520 is disposed in the grooves 540b in the two side walls. In this way, the second gear rack 520 can move along the chute 540a. A side of the second rod portion 522 may also be disposed in the groove 540b to improve the stability.

As shown in FIG. 8, a side wall of the groove 540b is further provided with a bar opening 540c. The bar opening 540c also extends along the groove 540b. The scissor arm 1111 connected to the second gear rack 520 may be disposed in the bar opening 540c. The scissor arm 1111 may be hinged to the second plate portion 521 of the second gear rack 520 by the pin shaft 1112. In the case that the scissor rack 110 is extended, the scissor arm 1111 connected to the second gear rack 520 may move along the bar opening 540c, and drive the second gear rack 520 to move by the pin shaft 1112.

The above is only an example of the second gear rack 520. The first gear rack 510 may be mounted on the track 540 in the same fashion.

Figure 9:
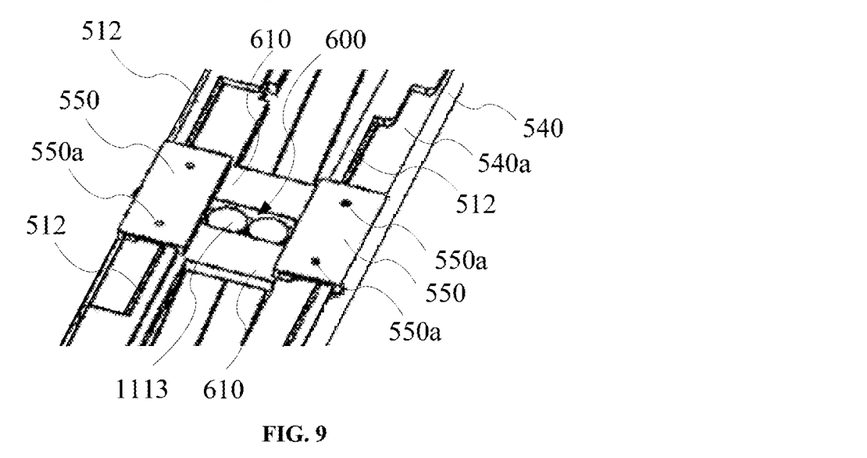
FIG. 9 is a schematic diagram of a local structure in FIG. 6.

FIG. 9 is a schematic diagram of a local structure in FIG. 6. As shown in FIG. 9, the limit mechanism 500 may further include a cover plate 550. The cover plate 550 is detachably connected to the track 540, and may be disposed in the middle portion of the track 540 to prevent the synchronizing gear 530 from falling off from the track 540, and may limit the first rod portion 512 of the first gear rack 510 and the second rod portion 522 of the second gear rack 520 to ensure that the first gear rack 510 and the second gear rack 520 are kept being meshed with the synchronizing gear 530. In addition, the cover plate 550 may also prevent impurities such as dust and sand from entering space between the synchronizing gear 530 and the first gear rack 510 and space between the synchronizing gear 530 and the second gear rack 520, and damaging teeth on the synchronizing gear 530, the first rod portion 512, and the second rod portion 522.

The cover plate 550 may be further provided with a through hole 550a. The rotating shaft of the synchronizing gear 530 may be disposed in the through hole 550a, such that the synchronizing gear 530 is more stable.

Optionally, the track 540 may be further provided with a limit structure. The scissor rack unit 111 may include two scissor arms 1111 and a limit portion 1113, wherein middle portions of the two scissor arms 1111 are hinged to each other, and the limit portion 1113 is disposed on the hinge axis of the two scissor arms 1111. In the case that the scissor rack 110 is folded, the limit structure is matched with the limit portion 1113 to limit displacement, in the axial direction of the roller 300, of the hinge axis of the two scissor arms 1111.

In the case that the first portion 210 and the second portion 220 are pushed together, the scissor rack 110 is in a folded state. Due to assembly clearance, etc., the first portion 210 and the second portion 220 are easily staggered in the axial direction of the roller 300, which may damage the flexible display screen. Owning to the limit structure matching with the limit portion 1113, displacement of the hinge axis of the two scissor arms 1111 in the axial direction of the roller 300 is limited, that is, displacement of the pin shaft 1112 hinged to the two scissor arms 1111 in the axial direction of the roller 300 is limited. In other words, the first portion 210 and the second portion 220 are limited, thereby preventing staggered movement between the first portion 210 and the second portion 220 in the axial direction of the roller 300.

As shown in FIG. 9, the limit structure includes two baffle plates 610. The two baffle plates 610 are disposed on a side, proximal to the scissor rack 110, of the track 540. The two baffle plates 610 are spaced apart in the length direction of the track 540. In the case that the scissor rack 110 is folded, the limit portion 1113 is disposed between the two baffle plates 610. Because the two baffle plates 610 are spaced apart in the length direction of the track 540, the space between the two baffle plates 610 constitutes a limit slot 600. The limit portion 1113 is clamped by the two baffle plates 610 to achieve a purpose of position limitation.

Optionally, along the hinge axis of the two scissor arms 1111, the two baffle plates 610 on the track 540 of one of the two limit mechanisms 500 are disposed on one side of the scissor rack 110, and the two baffle plates 610 on the track 540 of the other one of the two limit mechanisms 500 are disposed on the other side of the scissor rack 110. The two limit mechanisms 500 limit the scissor rack 110 from two sides of the scissor rack 110, such that the first portion 210 and the second portion 220 are more stable upon being pushed together.

Optionally, the limit portion 1113 may include a portion, disposed out of the scissor arm 1111, of the pin shaft 1112. Both ends of the pin shaft 1112 may be disposed out of the scissor arm 1111. In the case that the scissor rack 110 is folded, an end of the pin shaft 1112 enters the limit slot 600, and the pin shaft 1112 is clamped by the two baffle plates 610, such that displacement of the pin shaft 1112 is limited in the axial direction of the roller 300.

Figure 10:
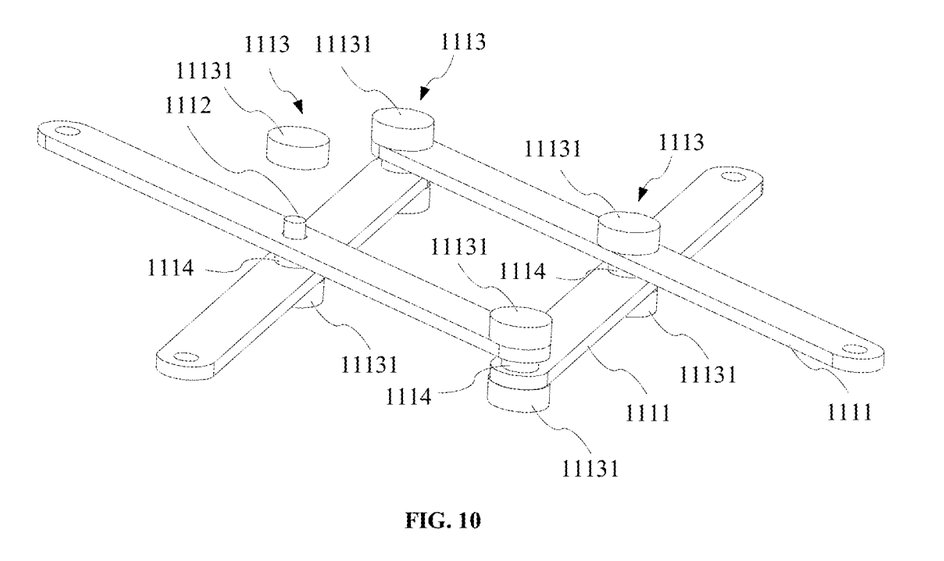
FIG. 10 is a schematic diagram of a local structure of a scissor rack according to an embodiment of the present disclosure.

The limit portion 1113 may further include an end cap 11131. FIG. 10 is a schematic diagram of a local structure of a scissor rack according to an embodiment of the present disclosure. As shown in FIG. 10, an end of the pin shaft 1112 is disposed out of the scissor arm 1111. End caps 11131 may be connected to two ends of the pin shaft 1112. The diameter of the end cap 11131 is greater than the diameter of the pin shaft 1112. In the case that the scissor rack 110 is folded, the end cap 11131 is disposed in the limit slot 600. The diameter of the pin shaft 1112 is usually small and not easy to match with the limit slot 600. Providing the end cap 11131 is equivalent to increasing the diameter of the pin shaft 1112, thereby facilitating matching with the limit slot 600.

The end cap 11131 on at least one end of the pin shaft 1112 is detachably connected to the pin shaft 1112, thereby facilitating connection between the pin shaft 1112 and the scissor arm 1111. For example, the end cap 11131 is connected to the pin shaft 1112 with threads.

As shown in FIG. 10, in the scissor rack 110, an elastic gasket 1114 is clamped between the hinged scissor arms 1111 and is disposed at a hinge joint between the scissor arms 1111. The elastic gasket 1114 is squeezed by the scissor arms 1111 and maintains a certain value of friction force between the elastic gasket 1114 and the scissor arm 1111. By adjusting the value of the friction force, in the case that a user pulls the first portion 210 and the second portion 220 or pushes the first portion 210 and the second portion 220 together, the scissor rack 110 may be folded or extended under the action of the pulling or pushing operation of the user. In the case that the user stops performing the operation, the scissor rack 110 can keep still under the action of the friction force, such that the spacing between the first portion 210 and the second portion 220 is kept unchanged.

For example, the elastic gasket 1114 may be a circular rubber gasket or sponge gasket. The elastic gasket 1114 sleeves the pin shaft 1112. Two ends of the elastic gasket 1114 are in respective contact with two scissor arms 1111 hinged to each other.

The value of the friction force may be adjusted by adjusting the end cap 11131. For example, in the case that the end cap 11131 is connected to the pin shaft 1112 with threads, the end cap 11131 may be screwed to make the hinged scissor arms 1111 to squeeze the elastic gasket 1114, thereby increasing the friction force, and on the contrary, the friction force can be decreased by unscrewing the end cap 11131.

Figure 11:
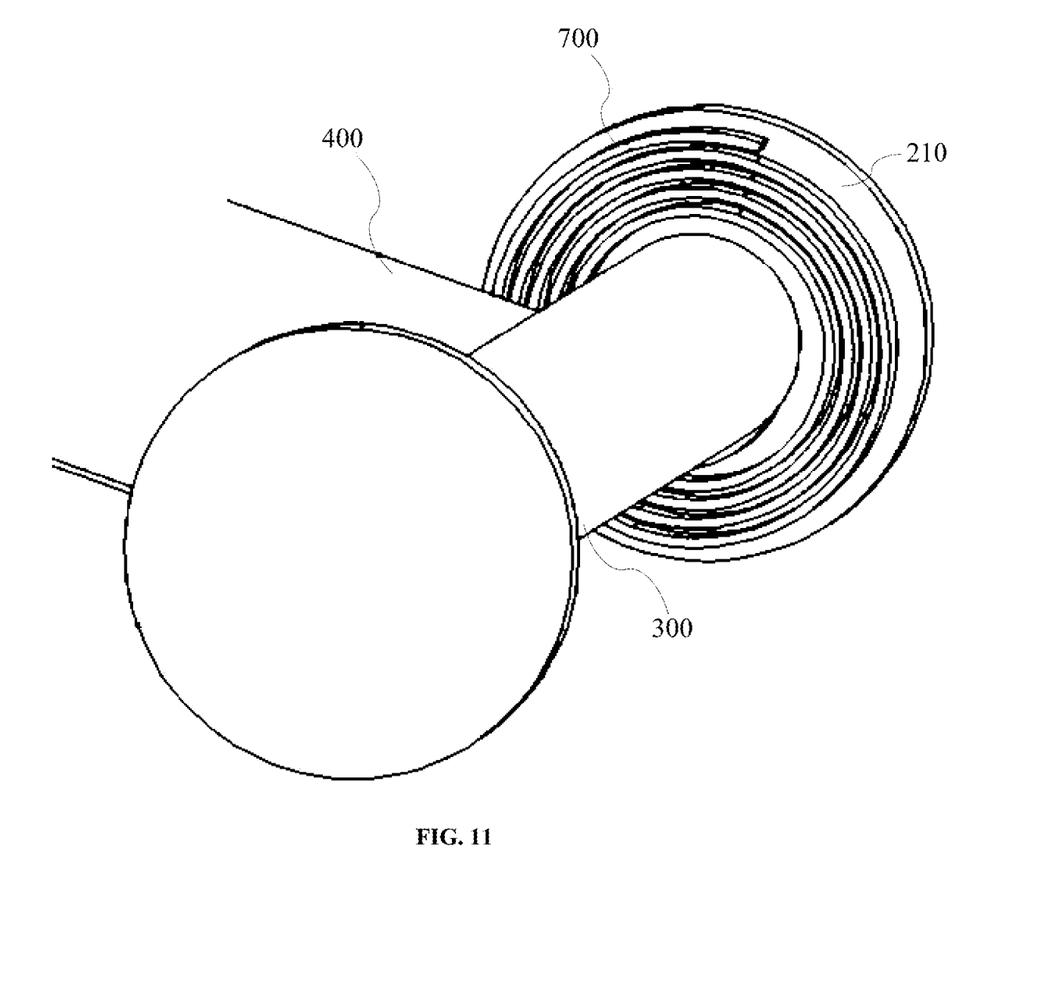
FIG. 11 is a schematic diagram of an internal structure of a first portion of a housing according to an embodiment of the present disclosure.

FIG. 11 is a schematic diagram of an internal structure of a first portion of a housing according to an embodiment of the present disclosure. The outer wall of the first portion 210 is partially omitted in this figure. As shown in FIG. 11, the flexible display apparatus further includes a roller spring (also referred to as torsional spring) 700. Both the first portion 210 and the roller 300 are connected to the roller spring 700. The roller spring 700 may provide extending force, and is accommodated in the first portion 210. In a process of pushing the first portion 210 and the second portion 220 together, the roller 300 rotates under the action of the roller spring 700, such that the flexible display screen 400 is collected into the first portion 210 and rolled on the roller 300. In addition, the roller spring 700 is usually a sheet metal strip. Because elastic force provided by the sheet metal strip that has been rolled for a certain quantity of laps is close to a constant value, using the roller spring 700 to provide extending force facilitates improvement on stability in a extending process.

Optionally, the flexible display apparatus may include two roller springs 700. The two roller springs 700 are disposed in at two ends of the roller 300 respectively. By disposing the roller springs 700 at both ends of the roller 300, forces on the roller 300 is more uniform, such that the flexible display screen 400 can be rolled more stably.

Figure 12:
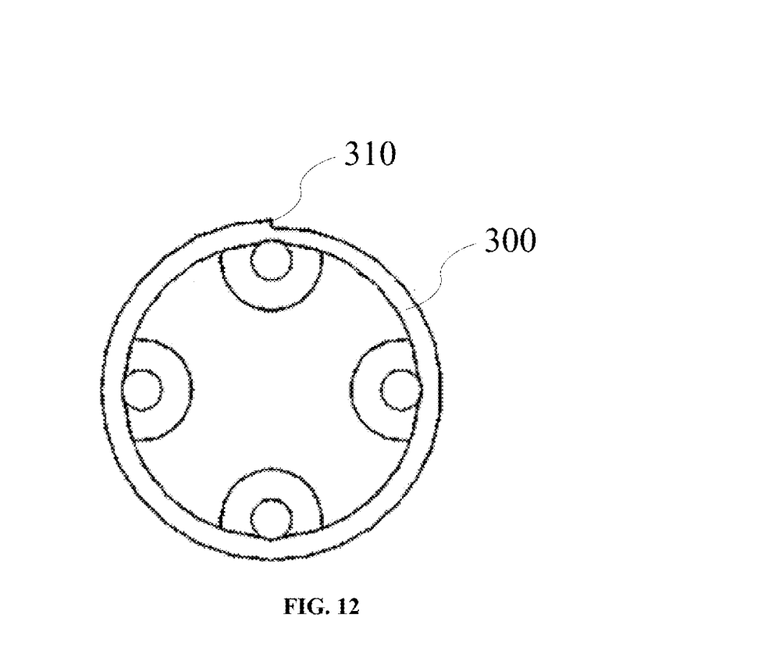
FIG. 12 is a sectional view of a roller according to an embodiment of the present disclosure.
Figure 13:
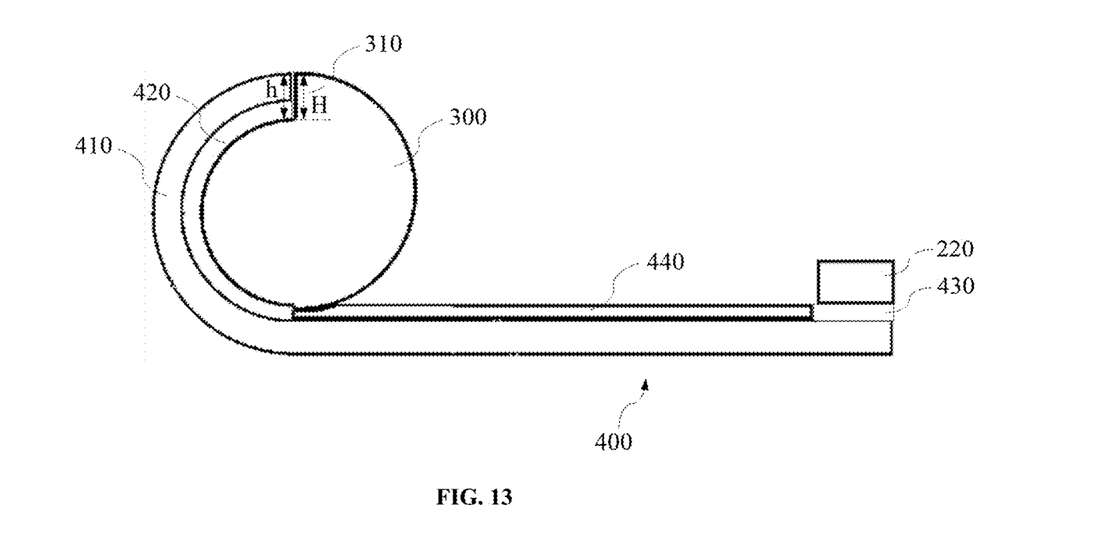
FIG. 13 is a schematic diagram of a local structure of a flexible display apparatus according to an embodiment of the present disclosure.

FIG. 12 is a sectional view of a roller according to an embodiment of the present disclosure. As shown in FIG. 12, the outer wall of the roller 300 is provided with a step portion 310. Providing the step portion 310 helps reduce stress on the roller 300 during extending of the flexible display screen 400. FIG. 13 is a schematic diagram of a local structure of a flexible display apparatus according to an embodiment of the present disclosure. This figure shows that the flexible display screen 400 is connected to the roller 300 and the second portion 220 of the housing 200. As shown in FIG. 13, one end of the flexible display screen 400 is disposed on the lower side of the step portion 310. A roller in the related art is not provided with the step portion 310, which makes, during extending of the flexible display screen 400, an offset between the second lap and the first lap. The offset is equal to the thickness of the flexible display screen 400, and may cause local stress concentration on the flexible display screen 400. By arranging the step portion 310, the flexible display screen 400 can be rolled on the roller 300 smoothly, thereby avoiding local stress concentration during extending of the flexible display screen 400, and conductive to prolonging the service life of the flexible display screen 400.

As shown in FIG. 13, a cross section of the outer wall of the roller 300 is a helix. The cross section is perpendicular to the axis of the roller 300. During extending of the flexible display screen 400, a extending radius increases gradually. By designing the cross section of the outer wall of the roller 300 as the helix, the flexible display screen 400 can be rolled on the roller 300 smoothly, thereby avoiding local stress concentration during extending of the flexible display screen 400.

As shown in FIG. 13, the height H of the step portion 310 is equal to the thickness h of the flexible display screen 400. In this way, in the case that one end of the flexible display screen 400 is connected to the lower side of the step portion 310, the surface of the flexible display screen 400 may be flush with the higher side of the step portion 310, thereby further avoiding local stress concentration during extending of the flexible display screen 400.

As shown in FIG. 13, the flexible display screen 400 includes a flexible cover plate 410, a first bonding layer 420, a second bonding layer 430, and a flexible display module 440. The first bonding layer 420, the second bonding layer 430, and the flexible display module 440 are disposed on one side of the flexible cover plate 410. The flexible display module 440 is disposed between the first bonding layer 420 and the second bonding layer 430. The first bonding layer 420 is connected to the roller 300. The second bonding layer 430 is connected to the second portion 220. By connecting the flexible cover plate 410 to the roller 300 and the second portion 220, the flexible cover plate 410 bears main extending force and reduce stress on the flexible display module 440, which is conductive to prolonging the service life of the flexible display module 440.

For example, the first bonding layer 420 and the second bonding layer 430 may be made of pressure-sensitive adhesive. The thickness of the first bonding layer 420 and the thickness of the second bonding layer 430 are equal to the thickness of the flexible display module 440, that is, in the case that the flexible display screen 400 is extended, surfaces of the first bonding layer 420, the second bonding layer 430, and the flexible display module 440 are flushed with each other.

The above descriptions are merely optional embodiments of the present disclosure, but are not intended to limit the present disclosure. Any modification, equivalent replacement, or improvement made without departing from the spirit and principle of the present disclosure shall fall within the protection scope of the present disclosure.

What is claimed is:

1. A flexible display apparatus, comprising a support frame, a housing, a roller, a flexible display screen, and a limit mechanism; wherein
the support frame comprises a scissor rack;
the housing comprises a first portion and a second portion that are detachable, wherein the first portion is disposed at one end of the scissor rack, and the second portion is disposed at the other end of the scissor rack;
the roller is disposed in the first portion, one end of the flexible display screen is connected to the roller, and the other end of the flexible display screen is connected to the second portion; and
the limit mechanism is connected to the scissor rack, and the limit mechanism is disposed on at least one of the first portion and the second portion to limit relative movement between a symmetry axis of the scissor rack and a portion where the limit mechanism is disposed, wherein the symmetry axis of the scissor rack is a symmetry axis extending in a stretching direction of the scissor rack.

2. The flexible display apparatus according to claim 1, wherein the limit mechanism comprises a first gear rack, a second gear rack, and a synchronizing gear; wherein
a length direction of the first gear rack is parallel to an axis of the roller, the first gear rack is parallel to the second gear rack, the first gear rack is hinged to one scissor arm at an end of the scissor rack, and the second gear rack is hinged to the other scissor arm at the end of the scissor rack; and
the synchronizing gear is disposed between the first gear rack and the second gear rack, and is meshed with the first gear rack and the second gear rack.

3. The flexible display apparatus according to claim 2, wherein the limit mechanism further comprises a track, wherein the first gear rack and the second gear rack are slidably mounted on the track, and the synchronizing gear is rotationally mounted on the track.

4. The flexible display apparatus according to claim 3, wherein
the first gear rack comprises a first plate portion and a first rod portion connected to each other, wherein one side of the first rod portion has teeth;
the second gear rack comprises a second plate portion and a second rod portion connected to each other, wherein one side of the second rod portion has teeth; and
the first plate portion and the second plate portion are both connected to the track and are spaced apart in a length direction of the track, the first rod portion and the second rod portion are both disposed in the length direction of the track and are both disposed between the first plate portion and the second plate portion, and the first rod portion and the second rod portion are spaced apart in a width direction of the track.

5. The flexible display apparatus according to claim 4, wherein the limit mechanism comprises one synchronizing gear; wherein the synchronizing gear is disposed between the first rod portion and the second rod portion, and the first gear rack and the second gear rack are symmetrically disposed about a center of the synchronizing gear.

6. The flexible display apparatus according to claim 3, wherein the scissor rack comprises a plurality of scissor rack units that are successively hinged, wherein each of the scissor rack units comprises two scissor arms and a limit portion, wherein middle portions of the two scissor arms are hinged to each other, and the limit portion is disposed on a hinge axis of the two scissor arms; and
the track is provided with a limit structure, wherein in the case that the scissor rack is folded, the limit structure is matched with the limit portion to limit displacement, in an axial direction of the roller, of the hinge axis of the two scissor arms.

7. The flexible display apparatus according to claim 6, wherein the limit structure comprises two baffle plates; wherein the two baffle plates are disposed on a side, proximal to the scissor rack, of the track, the two baffle plates are spaced apart in the length direction of the track, and in the case that the scissor rack is folded, the limit portion is disposed between the two baffle plates.

8. The flexible display apparatus according to claim 7, wherein the first portion and the second portion are each provided with the limit mechanism; wherein along the hinge axis of the two scissor arms, the two baffle plates on the track of one of the two limit mechanisms are disposed on one side of the scissor rack, and the two baffle plates on the track of the other one of the two limit mechanisms are disposed on the other side of the scissor rack.

9. The flexible display apparatus according to claim 6, wherein in the scissor rack an elastic gasket is clamped between the hinged scissor arms and is disposed at a hinge joint between the scissor arms.

10. The flexible display apparatus according to claim 1, wherein an outer wall of the roller is provided with a step portion, wherein one end of the flexible display screen is disposed on a lower side of the step portion.

11. The flexible display apparatus according to claim 10, wherein a cross section of an outer wall of the roller is a helix.

12. The flexible display apparatus according to claim 10, wherein a height of the step portion is equal to a thickness of the flexible display screen.

13. The flexible display apparatus according to claim 12, wherein the flexible display screen comprises a flexible cover plate, a first bonding layer, a second bonding layer, and a flexible display module; wherein the first bonding layer, the second bonding layer, and the flexible display module are disposed on one side of the flexible cover plate, the flexible display module is disposed between the first bonding layer and the second bonding layer, the first bonding layer is connected to the roller, and the second bonding layer is connected to the second portion.

14. The flexible display apparatus according to claim 1, further comprising two roller springs, wherein the two roller springs are respectively disposed at two ends of the roller, and both the first portion and the roller are connected to the roller springs.

15. The flexible display apparatus according to claim 4, wherein the limit mechanism comprises at least two synchronizing gears, wherein all the synchronizing gears are disposed between the first rod portion and the second rod portion, and are sequentially arranged in the length direction of the track.

16. The flexible display apparatus according to claim 13, wherein the first bonding layer and the second bonding layer are made of pressure-sensitive adhesive.

17. The flexible display apparatus according to claim 6, the track is provided with a chute extending in a length direction of the track, a side wall of the chute is provided with a bar opening, the bar opening extends along the chute, and a scissor arm connected to the second gear rack is disposed in the bar opening.

18. The flexible display apparatus according to claim 17, wherein a pin shaft is connected to an end of the scissor arm, and is disposed in the chute, and the scissor arm is hinged to a second plate portion having teeth of the second gear rack by the pin shaft.

19. The flexible display apparatus according to claim 18, wherein the limit portion comprises a portion of the pin shaft disposed out of the scissor arm, and both ends of the pin shaft are disposed out of the scissor arm.

20. The flexible display apparatus according to claim 19, wherein the limit portion further comprises an end cap, and the end cap is detachably connected to the pin shaft on at least one end of the pin shaft.

* * * * *